(12) United States Patent
Rajendran et al.

(10) Patent No.: US 8,121,558 B2
(45) Date of Patent: Feb. 21, 2012

(54) LOCAL OSCILLATOR GENERATOR ARCHITECTURE USING A WIDE TUNING RANGE OSCILLATOR

(75) Inventors: Gireesh Rajendran, Karnataka (IN); Nir Tal, Haifa (IL); Ashish Lachhwani, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 936 days.

(21) Appl. No.: 12/118,769

(22) Filed: May 12, 2008

(65) Prior Publication Data

US 2009/0280752 A1 Nov. 12, 2009

(51) Int. Cl.
*H04B 1/40* (2006.01)
*H04B 1/26* (2006.01)
*H03L 7/00* (2006.01)
(52) U.S. Cl. ............... 455/87; 455/77; 455/323; 331/34
(58) Field of Classification Search ..................... None
See application file for complete search history.

(56) References Cited

U.S. PATENT DOCUMENTS

| 4,225,828 | A | * | 9/1980 | Watanabe et al. ............... 455/76 |
|---|---|---|---|---|
| 6,404,293 | B1 | | 6/2002 | Darabi et al. |
| 6,452,909 | B1 | | 9/2002 | Bauer |
| 6,960,962 | B2 | | 11/2005 | Peterzell et al. |
| 7,508,898 | B2 | * | 3/2009 | Cyr et al. ........................ 375/376 |
| 2003/0030497 | A1 | * | 2/2003 | Duncan et al. ................... 331/34 |
| 2007/0140645 | A1 | * | 6/2007 | Marsili et al. .................... 386/23 |
| 2007/0298750 | A1 | * | 12/2007 | Masuda ........................ 455/323 |

OTHER PUBLICATIONS

Definition of "harmonic" in ATIS Telecom Glossary 2007 located at http://www.atis.org/glossary/definition.aspx?id=4719.*

* cited by examiner

*Primary Examiner* — Temesgh Ghebretinsae
*Assistant Examiner* — Gennadiy Tsvey
(74) *Attorney, Agent, or Firm* — Wade J. Brady, III; Frederick J. Telecky, Jr.

(57) ABSTRACT

A local oscillator (LO) generator architecture using a wide tuning range oscillator is disclosed. In one embodiment, a wide tuning oscillator based LO generator system includes a wide tuning range oscillator for generating a signal with a first initial frequency or a second initial frequency in response to a control voltage, a first frequency controlling circuit for converting the first initial frequency of the signal into a final frequency, and a second frequency controlling circuit for converting the second initial frequency of the signal into the final frequency.

20 Claims, 3 Drawing Sheets

LOCAL OSCILLATOR GENERATOR ARCHITECTURE USING A WIDE TUNING RANGE OSCILLATOR

FIELD OF TECHNOLOGY

Embodiments of the present invention relate to the field of electronics. More particularly, embodiments of the present invention relate to measurement systems, devices and circuits for a local oscillator generator.

BACKGROUND

A local oscillator (LO) is a device used to generate a signal which is beat against the signal of interest to mix it to a different frequency. The LO produces a signal which is injected into a mixer along with the signal from an antenna (e.g., or from a low noise amplifier (LNA) coupled to the antenna) or to the antenna (e.g., or to a power amplifier (PA) coupled to the antenna) in order to effectively produce the sum or difference of the two signals.

There are several traditionally known LO schemes. Firstly, a poly phase module coupled to an oscillator or a quadrature oscillator is used as a LO generator. However, if the LO generator under this scheme is used for a low IF transmit architecture which involves a PA, frequency of the LO generator output ends up being very close to the output frequency of the PA being transmitted where unwanted feedback from the PA to the LO generator can corrupt the LO generator output.

Another traditionally known scheme involves a frequency divider (e.g., with a factor of K) coupled to an oscillator. Since output frequency of a PA used for transmission is separated by output frequency of a LO generator coupled to the PA by the factor of K, this scheme can avoid the problem faced by the earlier traditional scheme. However, if a non-linear PA is used as the power amplifier (e.g., having more than 30 mV power output), $K^{th}$ harmonic of the PA output can become very close to the frequency of the LO generator output, where RF coupling paths can lead to corruption of the LO generator output.

FIG. 1A illustrates a traditional LO generator 100 implemented to rectify the problems discussed in the earlier two LO generator schemes. In FIG. 1A, an oscillator 102 generates a 1.6 GHz signal which is forwarded to a frequency divider 104 with a dividing factor of 2. Two buffers (e.g., a buffer 106 and a buffer 108) and a synthesizer 110 functions as a phase-locked loop (PLL) circuit which responds to both frequency and phase of the input signal (e.g., from a receiver input or to a transmitter output) by automatically raising or lowering frequency of the oscillator 102 until it is matched to the reference in both the frequency and the phase.

The in-phase and quadrature components having the frequency of 800 MHz coming out of the frequency divider 104 are added to the 1.6 GHz signal using a mixer 112 and a mixer 114, respectively, to generate 2.4 GHz in-phase and quadrature signals. The signals are forwarded to receiver (RX) mixers 116 through a buffer 118 and a buffer 120 during the receive mode. Alternatively, the signals are forwarded to transmitter (TX) mixers 122 through a buffer 124 and a buffer 126.

For modulation schemes or power levels where output of the transmitter power amplifier does not disturb the oscillator 102 (e.g., the output of the PA is much less than 30 mV), the scheme illustrated in FIG. 1A consumes additional power. In addition, during the receive mode which does not involve the PA, there is an additional power overhead due to the mixer 112 and the mixer 114 used to generate the signals being forwarded to the RX mixers 116.

Furthermore, as illustrated in frequency spectrum 150 of FIG. 1B, the LO generator 100 in FIG. 1A generates spurious harmonics (e.g., 0.8 GHz, 1.6 GHz, 3.2 GHz, etc.) due to mixing of the signals at the mixer 112 and the mixer 114. As a result, the LO generator 100 is forced to implement extra components (e.g., the buffer 118, the buffer 120, the buffer 124 and the buffer 126) to filter the emission of the spurious harmonics during the transmit mode and/or ward off jammers mixing with the spurious harmonics during the receive mode.

SUMMARY

A local oscillator (LO) generator architecture using a wide tuning range oscillator is disclosed. In one aspect, a wide tuning oscillator based LO generator system includes a wide tuning range oscillator for generating a signal with a first initial frequency or a second initial frequency in response to a control voltage, a first frequency controlling circuit for converting the first initial frequency of the signal into a final frequency, and a second frequency controlling circuit for converting the second initial frequency of the signal into the final frequency.

The final frequency forwarded by the first frequency controlling circuit is separated from the first initial frequency by a factor of at least two. In addition, the first initial frequency is not a harmonic of the final frequency forwarded by the first frequency controlling circuit. Also, the final frequency forwarded by the second frequency controlling circuit is separated from the second initial frequency by a factor of at least two. Furthermore, the control voltage is associated with an output level of a power amplifier (PA) transmitter coupled to the first frequency controlling circuit or the second frequency controlling circuit.

In another aspect, a wide tuning oscillator based LO generator includes a wide tuning range oscillator for generating a signal with a first initial frequency or a second initial frequency in response to a control voltage. The wide tuning range oscillator further includes a first frequency controlling circuit for converting the first initial frequency of the signal into a final frequency and a second frequency controlling circuit for converting the second initial frequency of the signal into the final frequency.

The first frequency controlling circuit comprises a first frequency divider for dividing the first initial frequency of the signal into a first frequency, a second frequency divider for dividing the first frequency into a second frequency, and a frequency combiner for adding the first frequency and the second frequency into the final frequency, where the final frequency forwarded by the first frequency controlling circuit is separated from the first initial frequency by a factor of at least two and where the first initial frequency is not a harmonic of the final frequency forwarded by the first frequency controlling circuit. In addition, the second frequency controlling circuit comprises a third frequency divider for dividing the second initial frequency of the signal into the final frequency.

The systems and apparatuses disclosed herein may be implemented in any means for achieving various aspects, and other features will be apparent from the accompanying drawings and from the detailed description that follows.

BRIEF DESCRIPTION OF THE DRAWINGS

Example embodiments are illustrated by the way of example and not limitation in the figures of the accompanying drawings, in which like references indicate similar elements and in which.

Other features of the present embodiments will be apparent from the accompanying drawings and from the detailed description that follows.

DETAILED DESCRIPTION

A local oscillator (LO) generator architecture using a wide tuning range oscillator is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "wide tuning oscillator" and "wide tuning range oscillator" are used interchangeably throughout the document. Further, the terms "power amplifier" and "power amplifier transmitter" are used interchangeably throughout the document. Also, the terms "low noise amplifier" and "low noise amplifier receiver" are used interchangeably throughout the document.

Figure 1A:
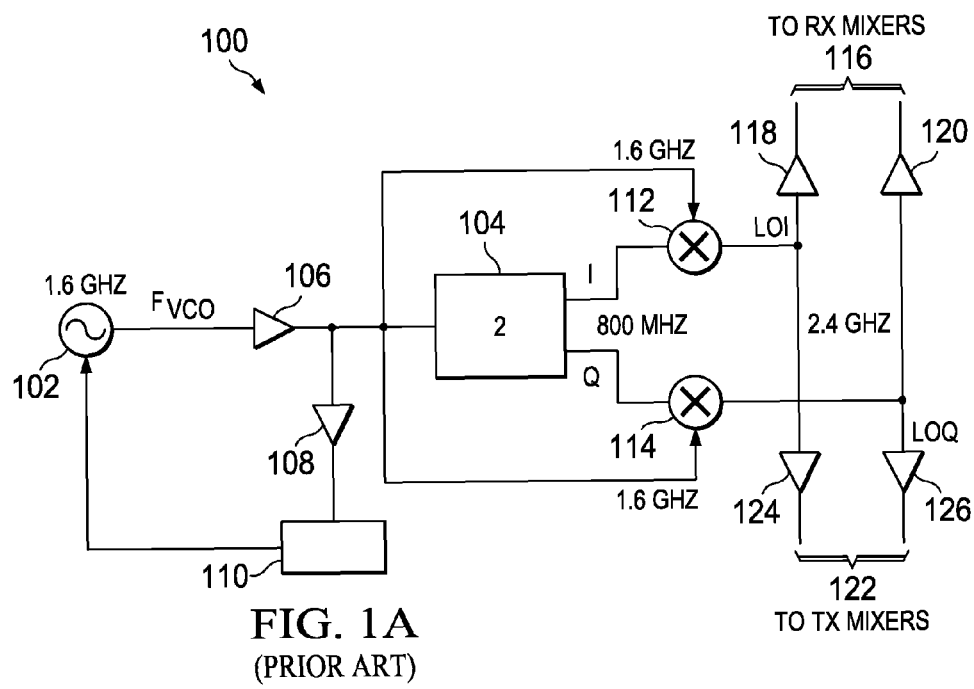
FIG. 1A is a block diagram illustrating a conventional local oscillator (LO) generator.
Figure 1B:
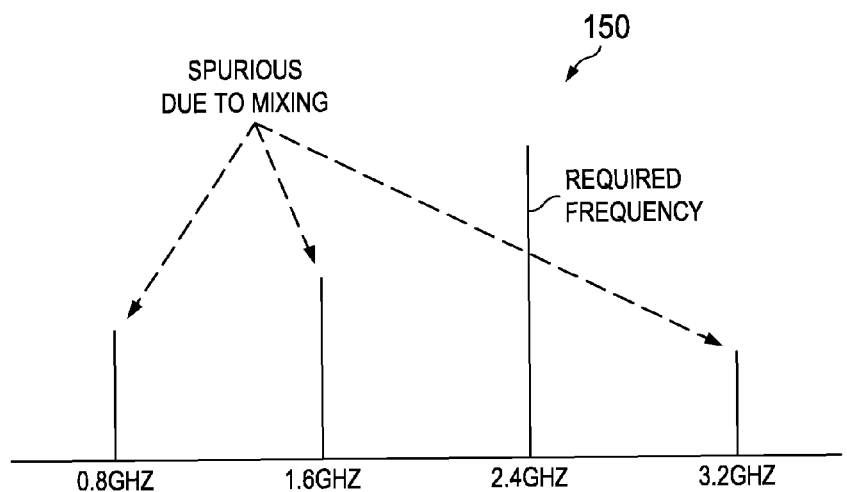
FIG. 1B is a spectrum of spurious signals generated due to mixing in the conventional LO generator shown in FIG. 1A.
Figure 2:
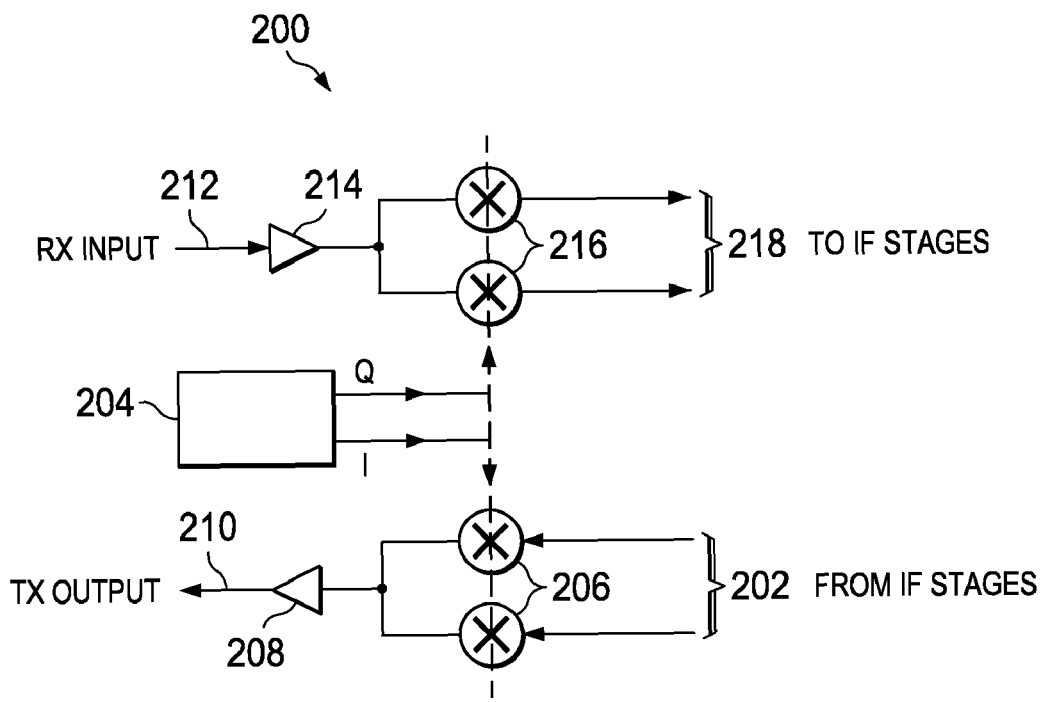
FIG. 2 is a block diagram for an exemplary transceiver based on a wide tuning oscillator based LO generator system, according to one embodiment.

FIG. 2 is a block diagram for an exemplary transceiver 200 based on a wide tuning oscillator based LO generator system 204, according to one embodiment. As shown in FIG. 2, the transceiver 200 comprises the wide tuning oscillator based LO generator system 204 for generating a signal (e.g., an in-phase signal and/or a quadrature signal) with a final frequency for mixing. In one embodiment, the final frequency is separated from an initial frequency by a factor (e.g., of 2).

As shown in FIG. 2, the transceiver 200 also includes transmitter (TX) mixers 206, a power amplifier (PA) 208, a low noise amplifier (LNA) 214, and receiver mixers 216. It is appreciated that, in the transmit mode of the transceiver 200, the transmitter mixers 206 up convert a transmitted signal with a constant intermediate frequency (IF) (e.g., from IF stages 202) using the frequency forwarded by the wide tuning oscillator based LO generator system 204 into the channel specific radio frequency (RF). The PA 208 then forwards the signal with a channel specific radio frequency (RF) as a transmitter (TX) output 210.

In the receive mode, the LNA 214 forwards a received signal (e.g., from receiver (RX) input 212) with a channel specific RF via an antenna. In one embodiment, the receiver mixers 216 down convert the received signal with a channel specific RF by the frequency forwarded by the wide tuning oscillator based LO generator system 204 into a constant IF.

In one exemplary implementation, the received signal with the constant IF is forwarded to IF stages 218.

Figure 3:
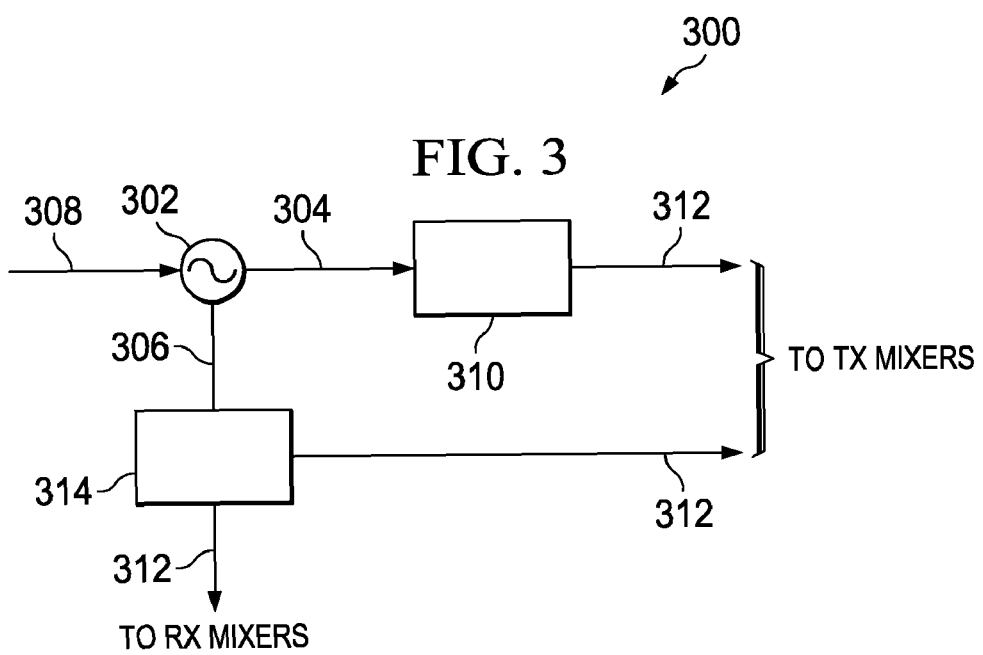
FIG. 3 is a block diagram for an exemplary wide tuning oscillator based LO generator system, according to one embodiment.

FIG. 3 is a block diagram for an exemplary wide tuning oscillator based LO generator system 300, according to one embodiment. It is appreciated that the wide tuning oscillator based LO generator system 300 is an exemplary embodiment of the wide tuning oscillator based LO generator system 204 in FIG. 2. As shown in FIG. 3, the LO generator system 300 includes a wide tuning range oscillator 302, a first frequency controlling circuit 310 and a second frequency controlling circuit 314.

In one embodiment, the wide tuning range oscillator 302 generates a signal with a first initial frequency 304 or a signal with a second initial frequency 306 in response to a control voltage 308. In one embodiment, the signal comprises an in-phase signal or a quadrature signal. The control voltage 308 is associated with an output level of a power amplifier (PA) transmitter coupled to the first frequency controlling circuit 310 or the second frequency controlling circuit 314 (e.g., during the transmit mode). It is appreciated that the PA transmitter is an exemplary embodiment of the PA 208. In an alternative embodiment, the control voltage 308 is associated with an output level of a low noise amplifier (LNA) during the receive mode. It is appreciated that the LNA is an exemplary embodiment of the LNA 214.

In one embodiment, the first frequency controlling circuit 310 converts the first initial frequency of the signal 304 into a final frequency of the signal 312. In one embodiment, the final frequency of the signal 312 forwarded by the first frequency controlling circuit 310 is separated from the first initial frequency of the signal 304 by a factor (i.e., of at least two). It is appreciated that the first initial frequency of the signal 304 is not a harmonic of the final frequency forwarded by the first frequency controlling circuit 310. In one embodiment, the second frequency controlling circuit 314 converts the second initial frequency of the signal 306 into the final frequency. It is appreciated that the final frequency of the signal 312 forwarded by the second frequency controlling circuit 314 is separated from the second initial frequency of the signal 306 by a factor (i.e., of at least two).

Figure 4:
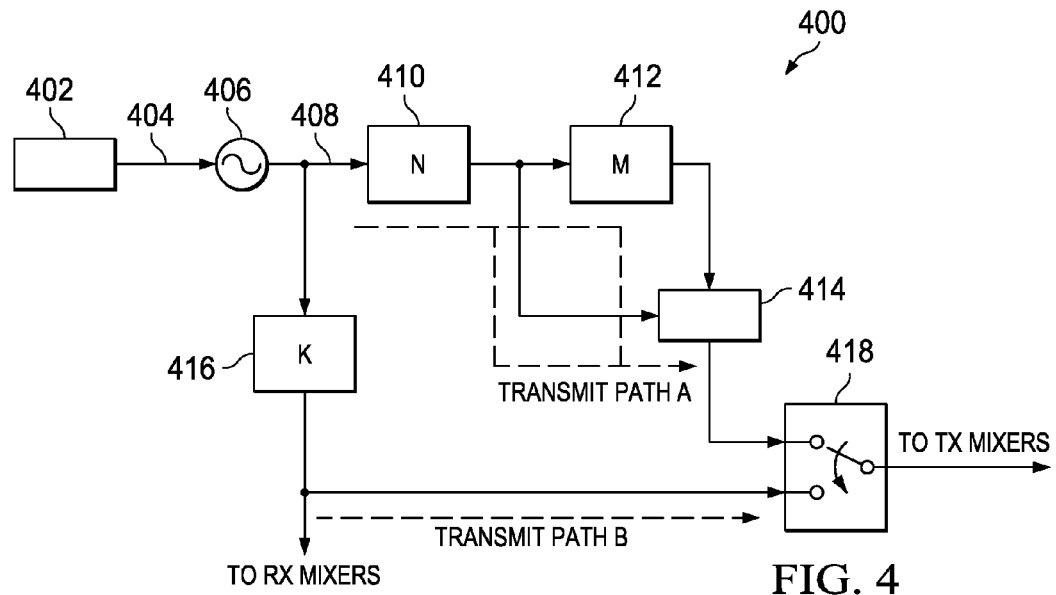
FIG. 4 is a schematic diagram of an exemplary wide tuning oscillator based LO generator, according to one embodiment.

FIG. 4 is a schematic diagram of an exemplary wide tuning oscillator based LO generator 400, according to one embodiment. It is appreciated that the wide tuning oscillator LO generator 400 is an exemplary embodiment of the wide tuning oscillator based LO generator system 300. In one embodiment, the LO generator 400 includes a phase lock loop (PLL) 402, a wide tuning range oscillator 406, frequency dividers 410, 412 and 416, a frequency combiner 414 and a multiplexer (MUX) 418.

As shown in FIG. 4, the PLL 402 is coupled to the wide tuning range oscillator 406. It is appreciated that the wide tuning range oscillator 406 is an exemplary embodiment of the wide tuning range oscillator 302. In one embodiment, the PLL 402 forwards the control voltage 404. In one embodiment, the wide tuning range oscillator 406 generates a signal (e.g., in-phase and/or quadrature signal 408) with a first initial frequency or a second initial frequency in response to the control voltage 404. In one exemplary implementation, the first initial frequency and the second initial frequency are 6.4 GHz and 4.8 GHz respectively.

In one exemplary implementation, if a transmitter power amplifier coupled to the wide tuning oscillator LO generator 400 transmits a high power signal (e.g., more than 30 mV), the control voltage 404 directs the wide tuning oscillator LO generator 400 to generate 6.4 GHz in-phase and/or quadrature signal. In one exemplary implementation, if the PA transmits a low power signal (e.g., less than 30 mV) or if the transceiver which comprises the wide tuning oscillator LO generator 400 is in the receive mode, the control voltage 404 directs the wide tuning oscillator LO generator 400 to generate 4.8 GHz in-phase and/or quadrature signal.

It is appreciated that the LO generator 400 includes a first frequency controlling circuit (e.g., which provides transmit path A) and a second frequency controlling circuit (e.g., which provides transmit path B). It is further appreciated that the first frequency controlling circuit and the second frequency controlling circuit are exemplary embodiments of the first frequency controlling circuit 310 and the frequency controlling circuit 314 respectively. The first frequency controlling circuit includes the frequency dividers 410 and 412, and the frequency combiner 414 for converting the first initial frequency of the signal into a final frequency.

In accordance with the example embodiment, the frequency divider 410 divides the first initial frequency of the signal 408 into a first frequency (e.g., N=4). In one exemplary implementation, the first frequency is 1.6 GHz. Further, the second frequency divider 412 divides the first frequency into a second frequency (e.g., M=2). In one exemplary implementation, the second frequency is 0.8 GHz. The frequency combiner 414 adds the first frequency and the second frequency into the final frequency. In one exemplary implementation, the final frequency is 2.4 GHz. It is appreciated that the final frequency forwarded by the frequency combiner 414 is separated from the first initial frequency by a factor of at least two. It is also appreciated that the first initial frequency is not a harmonic of the final frequency forwarded by the first frequency controlling circuit.

In one embodiment, the second frequency controlling circuit including the frequency divider 416 converts the second initial frequency of the signal into a final frequency. The frequency divider 416 is also coupled to receiver mixers which are further coupled to a low noise amplifier (LNA) on the receiver side. In one exemplary implementation, the frequency divider 416 divides (e.g., K=2) the second initial frequency into the final frequency. In one exemplary implementation, the second initial frequency and the final frequency are 4.8 GHz and 2.4 GHz respectively. It is appreciated that the final frequency forwarded by the second frequency controlling circuit is separated from the second initial frequency by a factor of at least two.

As shown in FIG. 4, the multiplexer 418 is coupled to the first frequency controlling circuit (e.g., which forms transmit path A) and the second frequency controlling circuit (e.g., which forms transmit path B). In one embodiment, the multiplexer 418 forwards the signal with the final frequency via the transmit path A or transmit path B based on the output level of the PA transmitter. The multiplexer 418 forwards the signal 408 with the final frequency via the transmit path A if the output level of the PA transmitter is greater than a threshold voltage (e.g., 30 mV). Alternatively, the multiplexer 418 forwards the signal with the final frequency via the transmit path B if the output level of the PA transmitter is less than the threshold voltage. In one embodiment, the multiplexer 418 is coupled to a transmitter mixers which are further connected to the PA transmitter.

It is appreciated that the wide tuning oscillator based LO generator 400 operates in the receive mode and the transmit mode. In one exemplary implementation, in the receive mode, the wide tuning range oscillator 406 is tuned to a frequency such that the frequency of the in-phase and the quadrature signal required for the receiver mixers is generated by dividing the wide tuning range oscillator 406 output frequency by a factor K (e.g., an integer like 2, 3, 4, etc.). It is appreciated that, in the receive mode, the wide tuning oscillator based LO generator 400 draws less power than the conventional LO generator since no mixer is used to generate the LO signal. In addition, the transceiver based on the wide tuning oscillator based LO generator 400, such as the transceiver 200 in FIG. 2, may not have any limitations on its receiver performance due to the spurious harmonics due to mixing.

In one embodiment, in the transmit mode, the wide tuning range oscillator 406 is tuned to an initial frequency which is processed through the frequency controlling circuit via the transmit path A. It is appreciated that the frequency controlling circuit is used to avoid any harmonic relation forming between its output frequency and the initial frequency. Alternatively, in the transmit mode, the wide tuning range oscillator 406 can be tuned to a frequency such that the required final frequency is equal to another initial frequency divided by a factor K. The signal is then forwarded via the transmit path B. It is appreciated that, in the transmit mode, power consumption of the wide tuning range oscillator 406 can be reduced if the frequency forwarded to the transmit mixers is generated by a simple division of the oscillator frequency using a frequency divider rather than using a mixer. Since no mixer is used for low power transmit operation, less power is consumed by the wide tuning range oscillator based LO generator 400 without occurrence of spurious harmonics.

Figure 5:
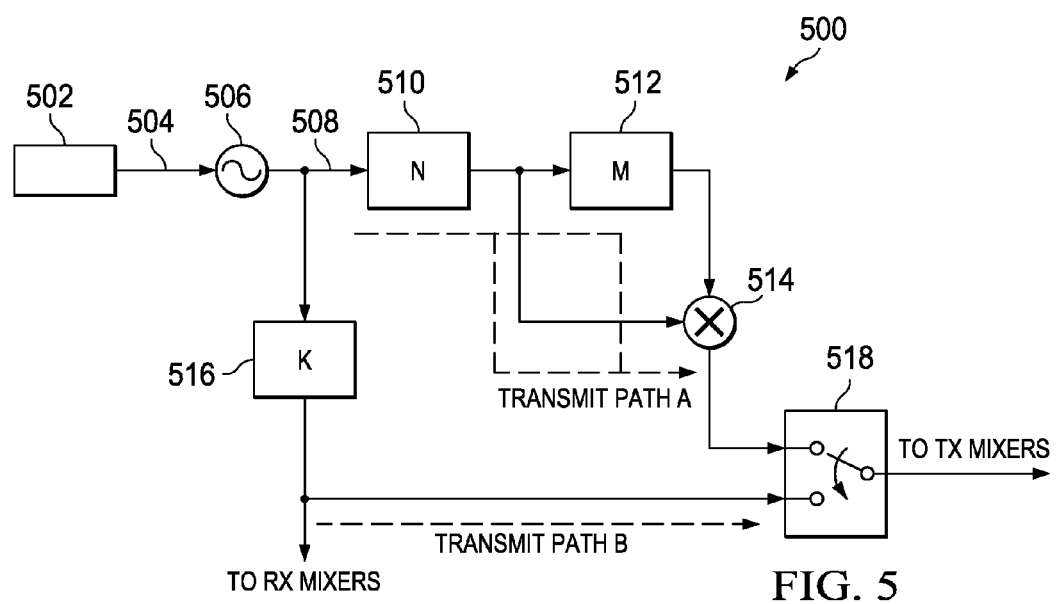
FIG. 5 is a schematic diagram of an exemplary wide tuning oscillator based LO generator using a mixer as the frequency combiner, according to one embodiment.

FIG. 5 is a schematic diagram of an exemplary wide tuning oscillator based LO generator 500 using a mixer as the frequency combiner, according to one embodiment. It is appreciated that the wide tuning oscillator based LO generator 500 is an exemplary embodiment of the wide tuning oscillator based LO generator 400 of FIG. 4. As shown in FIG. 5, the LO generator 500 includes a phase loop lock (PLL) 502, a wide range tuning oscillator 506, frequency dividers 510, 512 and 516, a mixer 514 and a multiplexer (MUX) 518. It is appreciated that the operation of the LO generator 500 is similar to the operation of the LO generator 400 of FIG. 4.

It is also appreciated that the PLL 502, the wide tuning range oscillator 506, the frequency dividers 510, 512 and 516, and a multiplexer 518 is an exemplary embodiment of the PLL 402, the wide tuning range oscillator 406, the frequency dividers 410, 412 and 416 and the multiplexer 418. In one embodiment, the mixer 514 can be used in place of the frequency combiner 414 of FIG. 4.

It is appreciated that the wide tuning oscillator based LO generator system generates the same LO frequency from different oscillator frequencies using the frequency conversion techniques shown in FIGS. 4 and 5. Further, in one embodiment, the LO generator system/scheme can generate a final frequency to the receiver by simply dividing by a factor (i.e., K) and transmit the final frequency that is harmonically unrelated to the wide tuning oscillator frequency. In one embodiment, the above-described system can switch the generation of the final frequency in the transmit mode to a simple divide by factor of two, a scheme which facilitates saving of power.

It is appreciated that, in the above-described transceiver, the flexibility in selecting "N" and "M" is high since the receive mode does not have spurs and the values can be selected such that the spurs due to them falls in a band where the emission specification is relaxed. For example, for a Bluetooth® transceiver application for mobile phones the required filtering can be achieved with a single LC filter.

Although the present embodiments have been described with reference to specific example embodiments, it will be evident that various modifications and changes may be made to these embodiments without departing from the broader spirit and scope of the various embodiments. For example, the various devices, modules, analyzers, generators, etc.

described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

What is claimed is:

1. A wide tuning oscillator based local oscillator (LO) generator system, comprising:
   a wide tuning range oscillator for generating a signal with one of a first initial frequency and a second initial frequency in response to a control voltage;
   a first frequency controlling circuit for converting the first initial frequency of the signal into a final frequency, wherein the final frequency forwarded by the first frequency controlling circuit is separated from the first initial frequency by a factor of at least two and wherein the first initial frequency is not a harmonic of the final frequency; and
   a second frequency controlling circuit for converting the second initial frequency of the signal into the final frequency, wherein the final frequency forwarded by the second frequency controlling circuit is separated from the second initial frequency by a factor of at least two and wherein the control voltage is associated with an output level of a power amplifier (PA) transmitter coupled to one of the first frequency controlling circuit and the second frequency controlling circuit.

2. The system of claim 1, further comprising a phase lock loop coupled to the wide tuning range oscillator for forwarding the control voltage.

3. The system of claim 1, further comprising a multiplexer coupled to the first frequency controlling circuit and the second frequency controlling circuit for forwarding the signal with the final frequency forwarded by one of the first frequency controlling circuit and the second frequency controlling circuit based on the output level of the PA transmitter.

4. The system of claim 3, wherein the multiplexer performs the forwarding the signal with the final frequency forwarded by the first frequency controlling circuit if the output level of the PA transmitter is greater than a threshold voltage and wherein the multiplexer performs the forwarding the signal with the final frequency forwarded by the second frequency controlling circuit if the output level of the PA transmitter is less than the threshold voltage.

5. The system of claim 4, wherein the signal comprises one of an in-phase signal and a quadrature signal.

6. The system of claim 4, wherein the multiplexer is coupled to at least one mixer which is further coupled to the PA transmitter.

7. The system of claim 1, wherein the first frequency controlling circuit comprises:
   a first frequency divider for dividing the first initial frequency of the signal into a first frequency;
   a second frequency divider for dividing the first frequency into a second frequency; and
   a frequency combiner for adding the first frequency and the second frequency into the final frequency.

8. The system of claim 7, wherein the first initial frequency is 6.4 GHz, the first frequency is 1.6 GHz, the second frequency is 0.8 GHz, and the final frequency is 2.4 GHz.

9. The system of claim 7, wherein the frequency combiner comprises a mixer.

10. The system of claim 1, wherein the second frequency controlling circuit comprises a third frequency divider for dividing the second initial frequency of the signal into the final frequency.

11. The system of claim 10, wherein the second initial frequency of the signal is 4.8 GHz and the final frequency is 2.4 GHz.

12. The system of claim, 10, wherein the third frequency divider is coupled to at least one mixer which is further coupled to a low noise amplifier (LNA) receiver.

13. A wide tuning oscillator based local oscillator (LO) generator, comprising:
   a wide tuning range oscillator for generating a signal with one of a first initial frequency and a second initial frequency in response to a control voltage;
   a first frequency controlling circuit for converting the first initial frequency of the signal into a final frequency, comprising:
     a first frequency divider for dividing the first initial frequency of the signal into a first frequency;
     a second frequency divider for dividing the first frequency into a second frequency;
     a frequency combiner for adding the first frequency and the second frequency into the final frequency, wherein the final frequency forwarded by the first frequency controlling circuit is separated from the first initial frequency by a factor of at least two and wherein the first initial frequency is not a harmonic of the final frequency; and
   a second frequency controlling circuit for converting the second initial frequency of the signal into the final frequency, comprising:
     a third frequency divider for dividing the second initial frequency of the signal into the final frequency, wherein the final frequency forwarded by the second frequency controlling circuit is separated from the second initial frequency by a factor of at least two and wherein the control voltage is associated with an output level of a power amplifier (PA) transmitter coupled to one of the first frequency controlling circuit and the second frequency controlling circuit.

14. The generator of claim 13, further comprising a phase lock loop coupled to the wide tuning range oscillator for forwarding the control voltage.

15. The generator of claim 13, further comprising a multiplexer coupled to the first frequency controlling circuit and the second frequency controlling circuit for forwarding the signal with the final frequency forwarded by the first frequency controlling circuit or the second frequency controlling circuit based on the output level of the PA transmitter.

16. The generator of claim 15, wherein the multiplexer performs the forwarding the signal with the final frequency forwarded by the first frequency controlling circuit if the output level of the PA transmitter is greater than a threshold voltage and wherein the multiplexer performs the forwarding the signal with the final frequency forwarded by the second frequency controlling circuit if the output level of the PA transmitter is less than the threshold voltage.

17. The generator of claim 13, wherein the frequency combiner comprises a mixer.

18. The system of claim 13, wherein the first initial frequency is 6.4 GHz, the second initial frequency of the signal is 4.8 GHz, the first frequency is 1.6 GHz, the second frequency is 0.8 GHz, and the final frequency is 2.4 GHz.

19. A transceiver with a wide tuning oscillator based local oscillator (LO) generator, comprising:
   a wide tuning oscillator based LO generator, comprising:

a phase lock loop for forwarding a control voltage;

a wide tuning range oscillator for generating a signal with one of a first initial frequency and a second initial frequency in response to the control voltage;

a first frequency controlling circuit for converting the first initial frequency of the signal into a final frequency, wherein the final frequency forwarded by the first frequency controlling circuit is separated from the first initial frequency by a factor of at least two and wherein the first initial frequency is not a harmonic of the final frequency; and a second frequency controlling circuit for converting the second initial frequency of the signal into the final frequency, wherein the final frequency forwarded by the second frequency controlling circuit is separated from the second initial frequency by a factor of at least two;

a low noise amplifier (LNA) for forwarding a received signal with a channel specific radio frequency (RF) via an antenna;

at least one receiver mixer for mixing the received signal with the channel specific RF and the signal with the final frequency into a received signal with a constant intermediate frequency (IF);

at least one transmitter mixer for mixing a transmitted signal with the constant IF and the signal with the final frequency into a transmitted signal with the channel specific RF;

a power amplifier (PA) for forwarding the transmitted signal; and a multiplexer coupled to the first frequency controlling circuit and the second frequency controlling circuit for forwarding the signal with the final frequency forwarded by the first frequency controlling circuit the second frequency controlling circuit to the power amplifier based on an output level of the power amplifier, wherein the control voltage is associated with an output level of the power amplifier.

20. The transceiver of claim 19, wherein the multiplexer performs the forwarding the signal with the final frequency forwarded by the first frequency controlling circuit if the output level of the PA is greater than a threshold voltage and wherein the multiplexer performs the forwarding the signal with the final frequency forwarded by the second frequency controlling circuit if the output level of the PA is less than the threshold voltage.

* * * * *